(12) United States Patent
Cho

(10) Patent No.: US 8,300,460 B2
(45) Date of Patent: Oct. 30, 2012

(54) NONVOLATILE MEMORY DEVICE

(75) Inventor: Ho Youb Cho, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 206 days.

(21) Appl. No.: 12/826,570

(22) Filed: Jun. 29, 2010

(65) Prior Publication Data

US 2010/0329008 A1    Dec. 30, 2010

(30) Foreign Application Priority Data

Jun. 29, 2009  (KR) ........................ 10-2009-0058463

(51) Int. Cl.
*G11C 11/34* (2006.01)
(52) U.S. Cl. ......... 365/185.05; 365/185.11; 365/185.12; 365/185.17; 365/185.18; 365/85.21; 365/185.29; 365/185.33 G
(58) Field of Classification Search ............. 365/185.05, 365/185.11, 185.12, 185.17, 185.18, 185.21, 365/185.29, 185.33
See application file for complete search history.

(56) References Cited

U.S. PATENT DOCUMENTS

| 7,149,130 | B2 * | 12/2006 | Lee ........................ | 365/185.33 |
| 7,224,617 | B2 * | 5/2007 | Takeuchi ................ | 365/185.12 |
| 7,660,162 | B2 * | 2/2010 | Cho ........................ | 365/185.21 |
| 7,729,177 | B2 * | 6/2010 | Song et al. ............... | 365/185.17 |
| 7,817,470 | B2 * | 10/2010 | Kim ........................ | 365/185.11 |
| 7,835,191 | B2 * | 11/2010 | Lee ......................... | 365/185.18 |
| 7,859,907 | B2 * | 12/2010 | Hosono et al. .......... | 365/185.21 |
| 7,944,758 | B2 * | 5/2011 | Kim et al. ................ | 365/185.12 |
| 8,027,201 | B2 * | 9/2011 | Lee ......................... | 365/185.17 |
| 8,050,115 | B2 * | 11/2011 | Kang et al. .............. | 365/185.05 |
| 8,059,460 | B2 * | 11/2011 | Jeong et al. .............. | 365/185.12 |
| 8,102,717 | B2 * | 1/2012 | Cha et al. ................ | 365/185.18 |
| 8,120,964 | B2 * | 2/2012 | Ahn ........................ | 365/185.21 |

FOREIGN PATENT DOCUMENTS

KR    1020080085539 A    9/2008

* cited by examiner

*Primary Examiner* — Trong Phan
(74) *Attorney, Agent, or Firm* — William Park & Associates Ltd.

(57) ABSTRACT

A nonvolatile memory device comprises a page buffer unit comprising page buffers, each coupling first and second input and output (IO) lines and a latch circuit for outputting data together or coupling a sense node and the first or second I/O line together, in response to an operation mode; a Y decoder unit comprising decoders, each selecting one or more of the page buffers in response to address signals and outputting a first or second control signal to the selected page buffers in response to the operation mode; a mode selection unit outputting first and second operation selection signals for selecting the operation mode; and an I/O control unit comprising I/O control circuits, each detecting data, inputted and output through the first and second I/O lines, and outputting the detected data or coupling one of the first and second I/O lines to a data line.

19 Claims, 7 Drawing Sheets

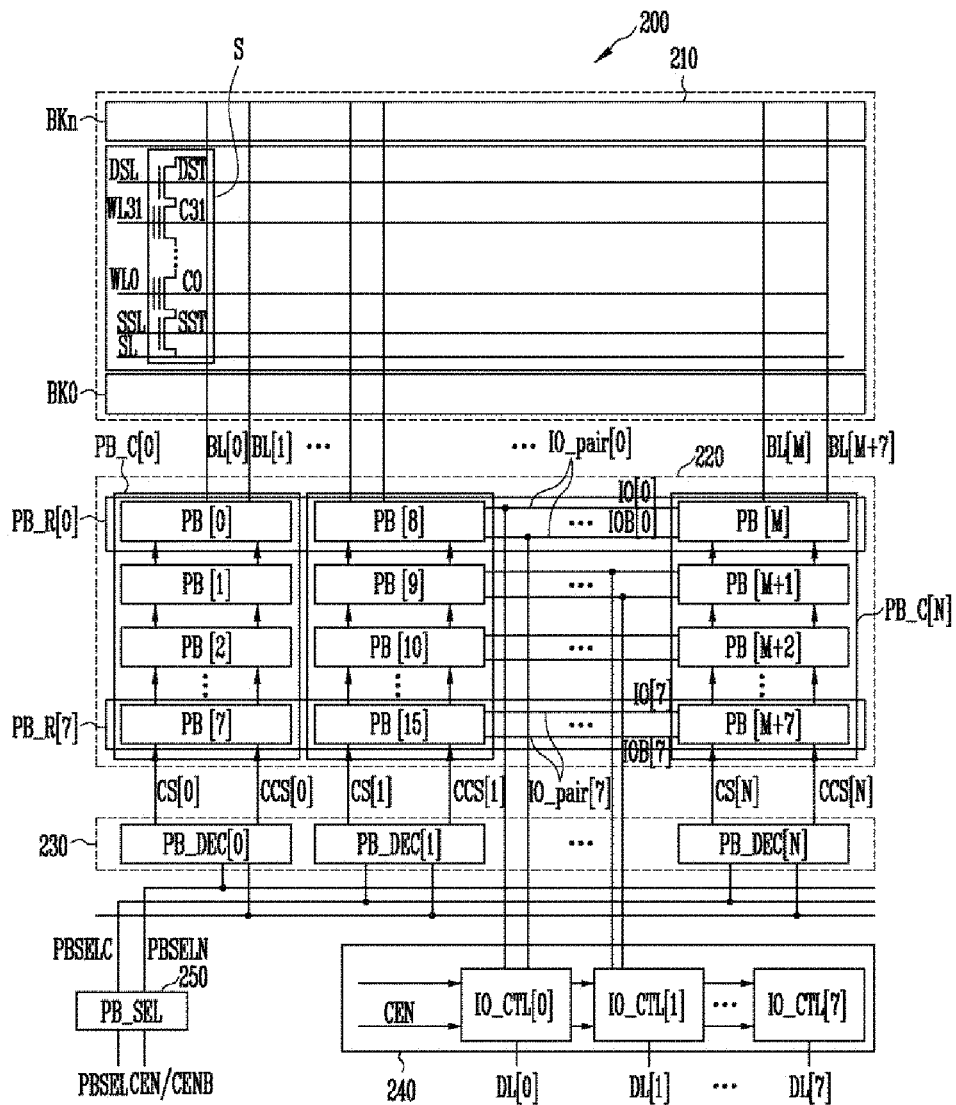

NONVOLATILE MEMORY DEVICE

CROSS-REFERENCE TO RELATED APPLICATION

Priority to Korean patent application number 10-2009-0058463 filed on Jun. 29, 2009, the entire disclosure of which is incorporated by reference herein, is claimed.

BACKGROUND

Exemplary embodiments relate generally to a nonvolatile memory device.

An erase operation for erasing data stored in a memory cell of a semiconductor memory device (in particular, a nonvolatile semiconductor memory device) which can be electrically erased and programmed and a program operation for programming data into a memory cell of the semiconductor memory device are performed through Fowler-Nordheim (F-N) tunneling and a hot electron injection method.

A NAND flash memory device (i.e., a nonvolatile memory device) includes page buffers, each reading data stored in a memory cell and storing the read data. An input and output (hereinafter referred to as 'I/O') line for outputting data output by the page buffer has an I/O pair structure.

FIG. 1A is a diagram showing a nonvolatile memory device 100.

Referring to FIG. 1A, the nonvolatile memory device 100 includes a memory cell array 110, a page buffer unit 120, a Y decoder unit 130, and an I/O control unit 140.

The memory cell array 110 includes a plurality of memory cells (not shown). The memory cells are coupled to bit lines BL[0] to BL[M+7].

The page buffer unit 120 includes page buffers PB[0] to PB[M+7] each coupled to one or more bit lines. In the nonvolatile memory device 100 of FIG. 1A, one page buffer is illustrated to be coupled to one bit line BL.

Each of the page buffers PB[0] to PB[M+7] receives data to be programmed into a selected one of the memory cells, coupled to the bit line BL coupled thereto, or reads data stored in a selected memory cell and stores and outputs the read data.

The Y decoder unit 130 couples the I/O control unit 140 and a selected one of the page buffers PB[0] to PB[M+7] together in response to a control signal.

The I/O control unit 140 performs the I/O of data between a page buffer, selected by the Y decoder unit 130, and an external I/O pad (not shown) of the nonvolatile memory device 100. The I/O control unit 140 includes a first I/O controller IO_CTL[0] to an eighth I/O controller IO_CTL[7].

As shown in FIG. 1A, the I/O control unit 140 of the nonvolatile memory device 100 includes the eight I/O controllers IO_CTL[0] and IO_CTL[7]. Accordingly, to comply with the layout of the eight I/O controllers IO_CTL, the page buffers PB[0] to PB[M+7] of the page buffer unit 120 have an eight-stage structure.

The page buffer unit 120 is configured in such a manner that the eight page buffers PB[0] to PB[7] forms a column, the page buffers PB[8] to PB[15] form a next column, and so on. The page buffer rows are configured in a row direction. In FIG. 1A, the number of page buffer columns is (N), and the number of page buffer rows is eight. Accordingly, M may be a multiple of the number of page buffers comprising a column of the page buffer unit 120. PB[M] may correspond to a page buffer in the first row and the last or right most column of the page buffers comprising the page buffer unit 120. Thus, for example, if the page buffer unit 120 comprises eight rows and eight columns, page buffer PB[M] may correspond to page buffer PB[56], and page buffer PB[M+1] may correspond to page buffer PB[57], etc. The variable M may also correspond to various bit lines. Thus, the first bit line may correspond to BL[M] when M is 0, etc.

The Y decoder unit 130 includes a $0^{th}$ decoder PB_DEC[0] to an $N^{th}$ decoder PB_DEC[N] for selecting the page buffers in the respective page buffer stages. The page buffer unit 120 may comprise N columns, and an $N^{th}$ column may refer to a particular column included in the page buffer unit 120. The variable N may be used as a zero based identifier of various components. For example, when N is '0' N may correspond to the first page buffer decoder PB_DEC[0]. Each of the decoders PB_DEC is coupled to each of the page buffer columns, each including the eight page buffers, and is configured to output a control signal to select the eight page buffers.

Each of the page buffer rows is coupled to a respective pair of I/O lines, such as I/O line pair IO[0] and IOB[0] to I/O line pair IO[7] and IOB[7]. The pairs of I/O lines are respectively coupled to the first I/O controller IO_CTL[0] through the eighth I/O controller IO_CTL[7].

For example, the pair of I/O lines IO[0] and IOB[0] are respectively coupled to the first I/O controller IO_CTL[0], while the pair of I/O lines IO[7] and IOB[7] are respectively coupled to the to the eighth I/O controller IO_CTL[7].

FIG. 1B is a circuit diagram of part of the page buffer unit 120 shown in FIG. 1A. This figure shows a simplified diagram of one of the page buffer rows of the page buffer unit 120 shown in FIG. 1A. Only the latches L of the page buffers are shown in order to illustrate a connection relationship between the page buffers and the I/O lines.

Of the page buffers, the page buffer PB[0] . . . PB[M] are shown and PB[0] is described as an example with reference to FIG. 1B. The remaining page buffers have the same construction as the page buffer PB[0].

The page buffer PB[0] includes a first latch L0 and first to fifth NMOS transistors N1 to N5.

The first latch L0 is configured to include two inverters and coupled between a node K1 and a node K2. The first and fourth NMOS transistors N1, N4 are in series coupled between the node K1 and a node K4. The second and fifth NMOS transistors N2, N5 are coupled in series between the node K2 and a node K5.

The third NMOS transistor N3 is coupled between the sense node SO of the page buffer and the node K3 of the second and fifth NMOS transistors N2, N5.

A first selection enable signal CENB is inputted to the gates of the first and second NMOS transistors N1, N2. A first selection signal CS[0] is inputted to the gates of the fourth and fifth NMOS transistors N4, N5. A second selection enable signal CEN is inputted to the gate of the third NMOS transistor N3.

The first I/O lines IO[0] and IOB[0] are respectively coupled to the node K4 and the node K5. The operation of the page buffer PB[0] is described later.

FIG. 1C is a circuit diagram of the Y decoder unit 130 shown in FIG. 1A.

Referring to FIG. 1C, the Y decoder unit 130 includes the first decoder PB_DEC[0] to the $N^{th}$ decoder PB_DEC[N]. Since each of the N decoders, PB_DEC[0] through PB_DEC[N], have the same construction, only the first decoder PB_DEC[0] is described as an example.

The first decoder PB_DEC[0] includes a first PMOS transistor P1, a first inverter IN1, and sixth to ninth NMOS transistors N6 to N9.

The first PMOS transistor P1 is coupled between a power supply voltage and a node K6. The gate of the first PMOS transistor P1 is coupled to a ground node. Accordingly, the first PMOS transistor P1 maintains a turn-on state.

The sixth to ninth NMOS transistors N6 to N9 are coupled in series between the node K6 and the ground node. A page buffer selection signal PBSEL is inputted to the gate of the sixth NMOS transistor N6. Y address signals YP[0], YA[0], and YB[0] are respectively inputted to the gates of the seventh to ninth NMOS transistors N7 to N9.

The Y address signals YP[0], YA[0], and YB[0] are used to select the page buffer stage. The Y address signals YP[0], YA[0], and YB[0] may be inputted to the decoders PB_DEC in different combinations as needed for the purpose of selecting the appropriate page buffer stage.

The first inverter IN1 inverts a voltage level of the node K6 and outputs the inverted voltage level as the selection signal CS[0].

The first I/O controller IO_CTL[0] which is coupled to the pair of I/O lines IO[0], IOB[0], has a construction such as that shown in FIG. 1D.

That is, FIG. 1D is a circuit diagram of the first controller IO_CTL[0] of the I/O control unit 140 shown in FIG. 1A.

Referring to FIG. 1D, the first I/O controller IO_CTL[0] includes a tenth NMOS transistor N10, a second inverter IN2, and an I/O sense amp (IOSA) 141.

The IOSA 141 senses data received from the pair of I/O lines IO[0], IOB[0] and amplifies and outputs the sensed data.

The tenth NMOS transistor N10 is coupled between the I/O line IOB[0] and a node K7. The second selection enable signal CEN is inputted to the gate of the tenth NMOS transistor N10.

The second inverter IN2 inverts data output from the IOSA 141 and outputs the inverted data to the node K7. The node K7 is coupled to a first data line DL[0].

The second inverter IN2 is operated in response to first and second data output enable signals DOEN and DOENB.

In the page buffer PB[0], and with the nonvolatile memory device 100 configured as described above with reference to FIGS. 1B to 1D, the control signal is inputted as follows in order to output data.

To output data stored in the first latch L[0], the first selection enable signal CENB is maintained at a high level, and the second selection enable signal CEN is maintained at a low level. "High level" and "low level" refers to, for example, the reference voltage levels applied or maintained at the various nodes as inputs or outputs. It is to be understood that, a high level or low level may correspond to voltage ranges that are predetermined to represent the high level or low level and not necessarily to any specific values. It is also to be understood that "high level" and "low level" may also be referred to as "logic levels" for example, a "high logic level" and a "low logic level," respectively.

The first and second NMOS transistors N1, N2 are turned on in response to the first selection enable signal CENB of a high level. Since the second selection enable signal CEN is maintained at a low level, the third NMOS transistor N3 is turned off.

To output data stored in the page buffer column including the page buffer PB[0], the first decoder PB_DEC[0] outputs the first selection signal CS[0] at a high level.

To this end, the page buffer selection signal PBSEL and the Y address signals YP[0], YA[0], and YB[0] are also at a high level and are inputted to the first decoder PB_DEC[0]. In response thereto, when the sixth to ninth NMOS transistors N6 to N9 are turned on, the node K6 is coupled to the ground node. Accordingly, the first selection signal CS[0] is at a high level, because the ground node at K6 becomes the input to the first inverter IN1 and is therefore inverted by the first inverter IN1, and output as CS[0] at a high level.

The fourth and fifth NMOS transistors N4, N5 of the page buffer PB[0] are turned on in response to the first selection signal CS[0] being at a high level as described above. Accordingly, data stored in the node K1 and data stored in the node K2, of the first latch L0, are respectively output to the I/O lines IO[0], IOB[0].

The IOSA 141 of the first I/O controller IO_CTL[0], which is coupled to the I/O lines IO[0], IOB[0], senses the data received from the I/O lines IO[0], IOB[0] and outputs the sensed data.

To output the data, the second inverter IN2 is operated in response to the first data output enable signal DOEN being at a high level and the second data output enable signal DOENB being at a low level. Accordingly, the data output from the IOSA 141 is inverted by the second inverter IN2 and then output to the first data line DL[0] via the node K7.

In the data output operation, in the state in which the first selection signal CS[0] of a high level has been received, data stored in the eight page buffers PB[0] to PB[7], each page buffer belonging to one page buffer stage, are respectively output through the first to eighth I/O controllers IO_CTL[0] to IO-CTL[7].

During the time for which data are not output, the first selection enable signal CENB shifts to a low level, and the second selection enable signal CEN shifts to a high level.

If the second selection enable signal CEN of a high level is received, the third NMOS transistor N3 is coupled to the sense node SO of the page buffer PB and is operated in a cell current measurement mode (CELL IV mode) in which current is measured in order to check a state of the threshold voltages of the memory cells of the memory cell array 110 which have been programmed. In the cell current measurement mode, the first selection enable signal CENB is maintained at a low level and the second selection enable signal CEN is maintained at a high level. The first selection signal CS[0] of a high level is inputted to the fourth and fifth NMOS transistors N4, N5.

The sense node SO of the page buffer PB[0] is coupled to a memory cell selected in order to measure its cell current, and so the cell current flows through the memory cell. When the third and fifth NMOS transistors N3, N5 are turned on, the cell current is transferred to the I/O line IOB[0].

In the first I/O controller IO_CTL[0], the tenth NMOS transistor N10 is turned on in response to the second selection enable signal CEN of a high level. Accordingly, the cell current is output to the first data line DL[0] via the I/O line IOB[0].

As described above, the page buffer PB[0] includes the first and second NMOS transistors N1, N2 turned on when data are inputted and output and the third NMOS transistor N3 configured to measure a cell current.

In this case, when data stored in the page buffer PB[0] are output, the first NMOS transistor N1 and the fourth NMOS transistor N4 are coupled in series together, and the second NMOS transistor N2 and the fifth NMOS transistor N5 are coupled in series together. However, the structure in which the MOS transistors are coupled in series together becomes a factor to deteriorate the performance of data input and output.

As described above, the page buffer requires two NMOS transistors for inputting and outputting data and one NMOS transistor for measuring a cell current. Accordingly, the number of elements is increased, thereby requiring eight stages. Consequently, the layout area constituting the page buffer is increased.

BRIEF SUMMARY

Exemplary embodiments relate to a nonvolatile memory device, which is capable of reducing the entire area of a page buffer by reducing the number of transistors for data input and output and cell current measurement and also of increasing the data input and output characteristic by reducing the number of transistors in series coupled to I/O lines.

A nonvolatile memory device according to an aspect of the present disclosure comprises a page buffer unit comprising page buffers, each coupling first and second input and output (I/O) lines and a latch circuit for outputting data together or coupling a sense node and the first or second I/O line together, in response to an operation mode; a Y decoder unit comprising decoders, each selecting one or more of the page buffers in response to address signals and outputting a first or second control signal to the selected page buffers in response to the operation mode; a mode selection unit outputting first and second operation selection signals for selecting the operation mode; and an I/O control unit comprising I/O control circuits, each detecting data, inputted and output through the first and second I/O lines, and outputting the detected data or coupling one of the first and second I/O lines to a data line.

The page buffers of the page buffer unit are arranged in the form of a matrix.

Each of the page buffers comprises first and second switching elements configured to respectively couple the first and second I/O lines and first and second nodes of the latch circuit together in response to the first control signal and a third switching element configured to couple the sense node and one of the first and second I/O lines together in response to the second control signal.

In each of the page buffers of even page buffer columns included in the page buffer unit, the third switching element is coupled between the sense node and the first I/O line. In each of the page buffers of odd page buffer columns included in the page buffer unit, the third switching element is coupled between the sense node and the second I/O line.

The page buffers included in one of page buffer rows of the page buffer unit are coupled to respective I/O line pairs, each comprising the first and second I/O lines, through the first and second switching elements.

The decoders are coupled to the respective page buffer columns and configured to select the respective page buffer columns and each output the first or second control signal in response to the operation mode.

Each of the decoders outputs the first control signal in response to the first operation selection signal indicative of a data I/O mode and outputs the second control signal in response to the second operation selection signal indicative of a cell current measurement mode.

Each of the decoders comprises a fourth switching element coupled between a power supply voltage input terminal and a third node and maintained at a turn-on state; a fifth switching element coupled between the power supply voltage input terminal and a fourth node and maintained at a turn-on state; a sixth switching element coupled between the third node and a fifth node and turned on in response to the first operation selection signal; a seventh switching element coupled between the fourth node and the fifth node and turned on in response to the second operation selection signal; a plurality of eighth switching elements configured to couple the fifth node and a ground node in response to the respective address signals; a first inverter configured to invert a voltage level of the third node and output an inverted voltage level as the first control signal; and a second inverter configured to invert a voltage level of the fourth node and output an inverted voltage level as the second control signal.

Each of the I/O control circuits comprises a ninth switching element configured to couple the first I/O line and the data line together in response to a first page buffer selection signal for selecting the even page buffer columns in a cell current measurement mode; a tenth switching element configured to couple the second I/O line and the data line together in response to a second page buffer selection signal for selecting the odd page buffer columns in the cell current measurement mode; a data sense unit configured to detect data coupled to the first and second I/O lines in a data I/O mode and output the detected data; and a third inverter configured to invert the data output by the data sense unit in response to a data I/O enable signal and output the inverted data to the data line.

The I/O control circuit further comprises a first AND gate and a second AND gate. Here, the first AND gate performs an AND operation of the first page buffer selection signal and a first enable signal for enabling measurement of a cell current, and the second AND gate performs an AND operation of the first enable signal and the second page buffer selection signal. The ninth switching element is operated in response to an output signal of the first AND gate, and the tenth switching element is operated in response to an output signal of the second AND gate.

The mode selection unit comprises a third AND gate for performing an AND operation of the first or second page buffer selection signal and a second enable signal having an opposite logic level to the first enable signal and a fourth AND gate for performing an AND operation of the first enable signal and the page buffer selection signal. The output signal of the third AND gate is the first control signal, and the output signal of the fourth AND gate is the second control signal.

A nonvolatile memory device according to another aspect of the present disclosure comprises a page buffer unit, comprising page buffers arranged in the form of a matrix and coupled to I/O line pairs corresponding to respective page buffer rows, wherein each of the page buffers is coupled to one or more of bit lines to which memory cells are coupled through a sense node and configured to couple each of the I/O line pairs and a latch circuit for outputting data together in response to an operation mode or to select one I/O line of the I/O line pair and to couple the selected the I/O line and the sense node; a Y decoder unit, comprising first to $N^{th}$ decoders coupled to respective N page buffer columns of the page buffer unit and each configured to output a first or a second control signal in response to address signals and first and second operation mode selection signals, where Nth corresponds to a column of the page buffer unit; a mode selection unit outputting the first and second operation selection signals for selecting the operation mode; and an I/O control unit, comprising control circuits coupled to line pairs, respectively, and each configured to detect data inputted and output through each of the line pairs and output the detected data or to couple one of the first or second I/O lines to a data line.

Each of the page buffers comprises first and second switching elements configured to couple first and second nodes of the latch circuit and first and second I/O lines of the I/O line pair, respectively, in response to the first control signal for data input and output and third switching element coupled between each of the sense nodes and any one of the first and second I/O line in response to the second control signal for measuring a cell current.

In each of the page buffers of even page buffer columns included in the page buffer unit, the third switching element is coupled between the sense node and the first I/O line. In each of the page buffers of odd page buffer columns included in the page buffer unit, the third switching element is coupled between the sense node and the second I/O line.

Each of the decoders outputs the first control signal in response to the first operation selection signal indicative of a data I/O mode and outputs the second control signal in response to the second operation selection signal indicative of a cell current measurement mode.

Each of the decoders comprises a fourth switching element coupled between a power supply voltage input terminal and a third node and maintained at a turn-on state; a fifth switching element coupled between the power supply voltage input terminal and a fourth node and maintained at a turn-on state; a sixth switching element coupled between the third node and a fifth node and turned on in response to the first operation selection signal; a seventh switching element coupled between the fourth node and the fifth node and turned on in response to the second operation selection signal; a plurality of eighth switching elements configured to couple the third node and a ground node in response to the respective address signals; a first inverter configured to invert a voltage level of the third node and output an inverted voltage level as the first control signal; and a second inverter configured to invert a voltage level of the fourth node and output an inverted voltage level as the second control signal.

Each of the I/O control circuits comprises a ninth switching element configured to couple the first I/O line and the data line together in response to a first page buffer selection signal for selecting the even page buffer columns in a cell current measurement mode; a tenth switching element configured to couple the second I/O line and the data line together in response to a second page buffer selection signal for selecting the odd page buffer columns in the cell current measurement mode; a data sense unit configured to detect data coupled to the first and second I/O lines in a data I/O mode and output the detected data; and a third inverter configured to invert the data output by the data sense unit in response to a data I/O enable signal and output the inverted data to the data line.

Each of the control circuits further comprises a first AND gate and a second AND gate. Here, the first AND gate performs an AND operation of the first page buffer selection signal and a first enable signal for enabling measurement of a cell current, and the second AND gate performs an AND operation of the first enable signal and the second page buffer selection signal. The ninth switching element is operated in response to an output signal of the first AND gate, and the tenth switching element is operated in response to an output signal of the second AND gate.

The mode selection unit comprises a third AND gate for performing an AND operation of the first or second page buffer selection signal and a second enable signal having an opposite logic level to the first enable signal; and a fourth AND gate for performing an AND operation of the first enable signal and the page buffer selection signal. Here, the output signal of the third AND gate is the first control signal, and the output signal of the fourth AND gate is the second control signal.

BRIEF DESCRIPTION OF THE DRAWINGS

FIG. 2A is a diagram showing a nonvolatile memory device according to an embodiment of this disclosure;

DESCRIPTION OF EMBODIMENTS

Figure 1A:
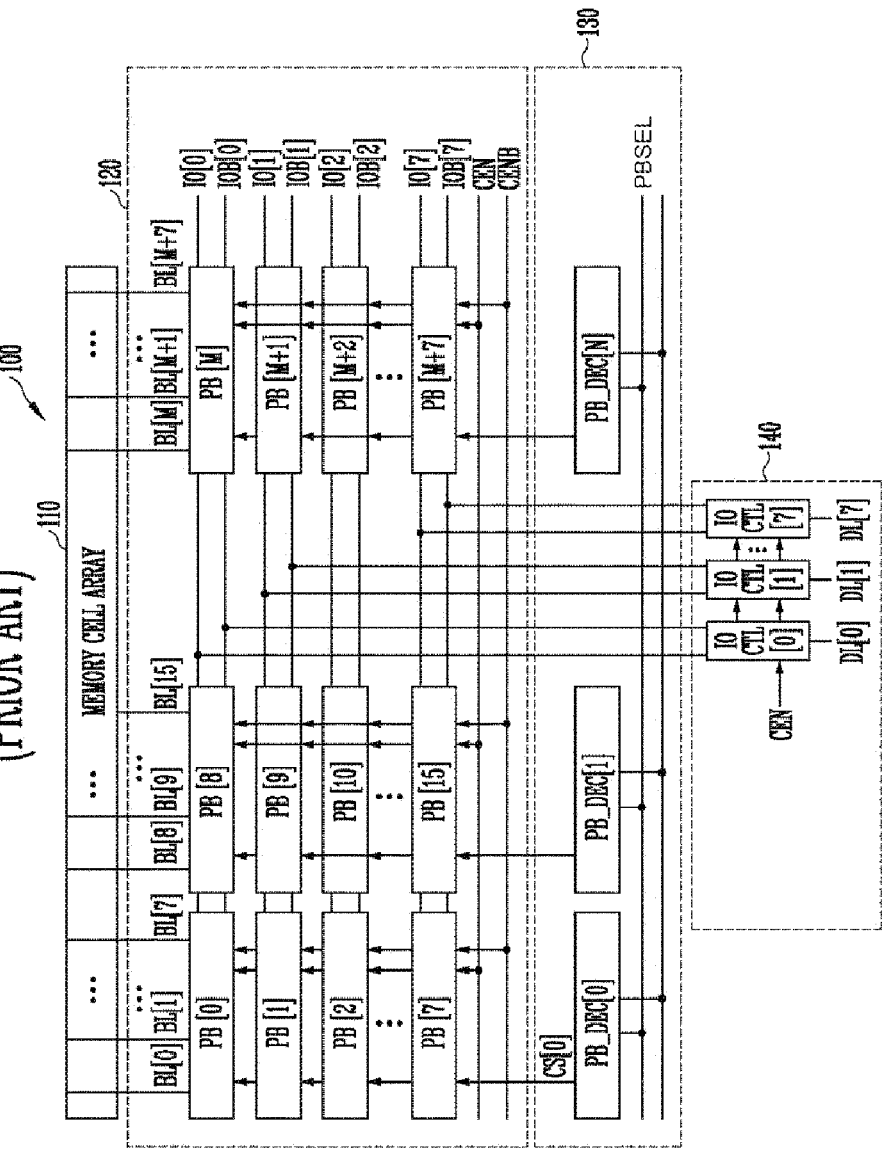
FIG. 1A is a diagram showing a nonvolatile memory device.
Figure 1B:
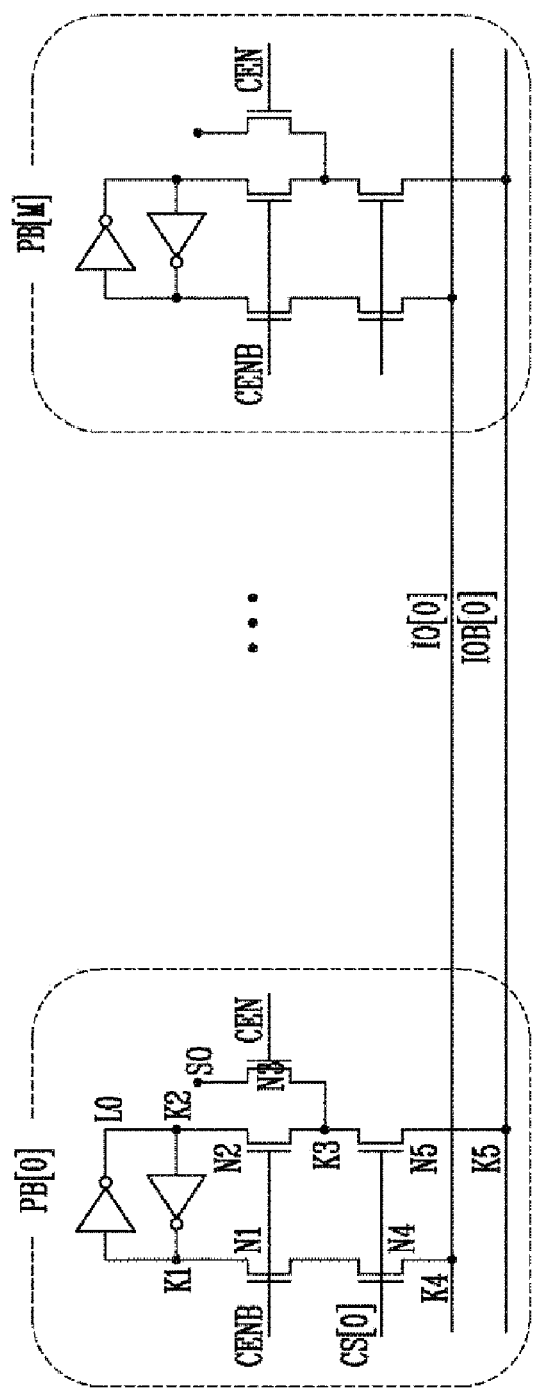
FIG. 1B is a circuit diagram of part of a page buffer unit shown in FIG. 1A.
Figure 1C:
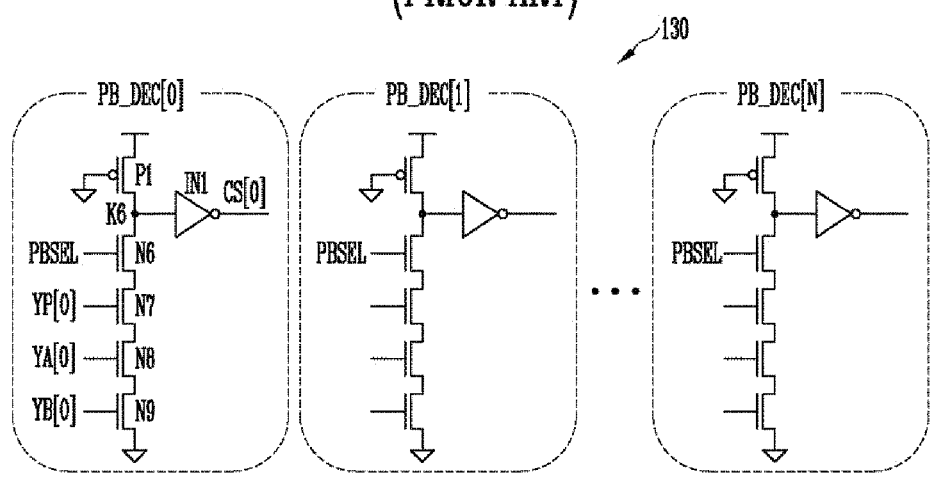
FIG. 1C is a circuit diagram of a Y decoder unit shown in FIG. 1A.
Figure 1D:
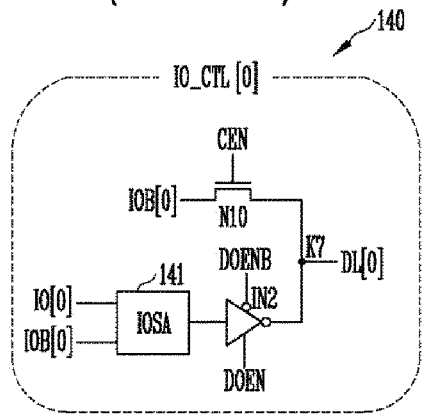
FIG. 1D is a circuit diagram of the I/O controller IO_CTL [0] of an I/O control unit shown in FIG. 1A.

Hereinafter, some exemplary embodiments of the present disclosure will be described in detail with reference to the accompanying drawings. The figures are provided to allow those having ordinary skill in the art to understand the scope of the embodiments of the disclosure.

FIG. 2A is a diagram showing a nonvolatile memory device according to an embodiment of this disclosure.

Referring to FIG. 2A, the nonvolatile memory device 200 according to the embodiment of this disclosure includes a memory cell array 210, a page buffer unit 220, a Y decoder unit 230, an I/O control unit 240, and a page buffer selector PB_SEL 250.

The memory cell array 210 includes a number of memory blocks Bk0 to BKn. Each of the memory blocks includes a plurality of cell strings S. Each of the cell strings S includes plurality of memory cells C0 to C31 coupled in series between a drain select transistor DST and a source select transistor SST.

The gates of the memory cells C of the cell strings S are coupled to respective word lines WL0 to WL31. The gates of the drain select transistors DST of the cell strings S are coupled to a drain selection line DSL. The gates of the source select transistors SST of the cell strings S are coupled to a source selection line SSL.

The drains of the drain select transistors DST of the cell strings S are coupled to respective bit lines BL[0] to BL[M+7]. The sources of the source select transistors SST of the cell strings S are coupled to a common source line SL.

The cell strings S included in all the memory blocks BK0 to BKn are coupled to the bit lines BL[0] to BL[M+7].

The page buffer unit 220 includes first to (M+7)$^{th}$ page buffers PB[0] to PB[M+7]. The first to (M+7)$^{th}$ page buffers PB[0] to PB[M+7] are coupled to the bit lines BL[0] to BL[M+7]. Each of the page buffers stores data to be programmed or stores read data.

The first to (M+7)$^{th}$ page buffers PB[0] to PB[M+7] of the page buffer unit 220 form first to eighth page buffer rows PB_R[0] to PB_R[7] and also form first to N$^{th}$ page buffer columns PB_C[0] to PB_C[N]. Where the page buffer unit 220 may comprise N columns, and an N$^{th}$ column may refer to a particular column included in the page buffer unit 220. The variable N may be used as a zero based identifier of various components. For example, when N is '0' N may correspond to the first page buffer PB[0]. As discussed below, the variable N may also be used as a zero based identifier of page buffer decoders, for example PB_DEC[0] to PB_DEC [N], selection signal signals, for example CS[0] to CS[N], and cell current selection signals, for example CCS[0] to CCS[N]. In other words, the first to (m+7)$^{th}$ page buffers PB[0] to PB[M+7] are arranged in the form of an 8×(N+1) matrix. Where M and M$^{th}$ variables may be a multiple of a number page buffers comprising a column in the page buffer unit 220. In particular, in FIGS. 2A and 2B the M and M$^{th}$ page buffer may correspond to the page buffer in the first row and the last or right most column of the page buffers comprising the page buffer unit 220. Thus, for example, if the page buffer unit 220 comprises eight rows and eight columns, M may be 56 and may correspond to page buffer PB[56], and page buffer PB[M+1] may correspond to page buffer PB[57], etc. In other examples, the M and $M^{th}$ variables may refer to other page buffers comprising the page buffer unit 220, or other components of the memory device 200.

The first page buffer row PB_R[0] (seen in FIG. 2A and FIG. 2B) includes the first, ninth, . . . , $M^{th}$ page buffers PB[0], PB[8], . . . , PB[M]. The first page buffer column PB_C[0] includes the first to eighth page buffers PB[0] to PB[7].

The first page buffer row PB_R[0] includes the first, ninth, . . . , $M^{th}$ page buffers PB[0], PB[8], . . . , PB[M]. The first page buffer column PB_C[0] includes the first to eighth page buffers PB[0] to PB[7].

The nonvolatile memory device 200 according to an embodiment of this disclosure includes first to eighth I/O line pairs IO_pair[0] (i.e., IO[0] and IOB[0]) to IO_pair[7] (i.e., IO[7] and IOB[7]). The first to eighth I/O line pairs are respectively coupled to the first to eighth page buffer rows PB_R[0] to PB_R[7] through data I/O lines. The first to $N^{th}$ page buffer columns PB_C[0] to PB_C[N] have different even and odd page buffer circuits.

A detailed construction of the page buffer is described later with reference to FIG. 2B.

The Y decoder unit 230 includes first to $N^{th}$ decoders PB_DEC[0] to PB_DEC[N] respectively coupled to the first to $N^{th}$ page buffer columns PB_C[0] to PB_C[N].

Each of the decoders selects a page buffer stage coupled thereto so that data can be inputted and output through a corresponding I/O line pair.

The I/O control unit 240 includes first to eighth controllers IO_CTL[0] to IO_CTL[7] respectively coupled to the first to eighth I/O line pairs IO_pair[0] to IO_pair[7]. The first to eighth controllers IO_CTL[0] to IO_CTL[7] detect data inputted and output to and from the respective I/O line pairs and transfer the detected data to first to eight data lines DL[0] to DL[7], respectively. All the I/O lines of the first to eighth I/O line pairs are respectively referred to as first to sixteenth I/O lines IO[0], IOB[0], . . . , IOB[7]. Accordingly, the first I/O line pair IO_pair[0] includes the first and second I/O lines IO[0], IOB[0].

The page buffer selector 250 outputs a first page buffer selection signal PBSELN for data input and output and a second page buffer selection signal PBSELC for cell current measurement in response to a page buffer selection signal PBSEL and first and second selection enable signals CEN, CENB.

The page buffer selector 250 outputs the first page buffer selection signal PBSELN at a high level when data are normally inputted and output and outputs the second page buffer selection signal PBSEL at a high level in a mode in which a cell current is measured. The first and second page buffer selection signals PBSELN, PBSELC are not output at a high level at the same time, but the first and second page buffer selection signals PBSELN, PBSELC are output at different logic levels at the same time.

The construction of the nonvolatile memory device 200 according to an embodiment of this disclosure is described in more detail below.

Figure 2B:
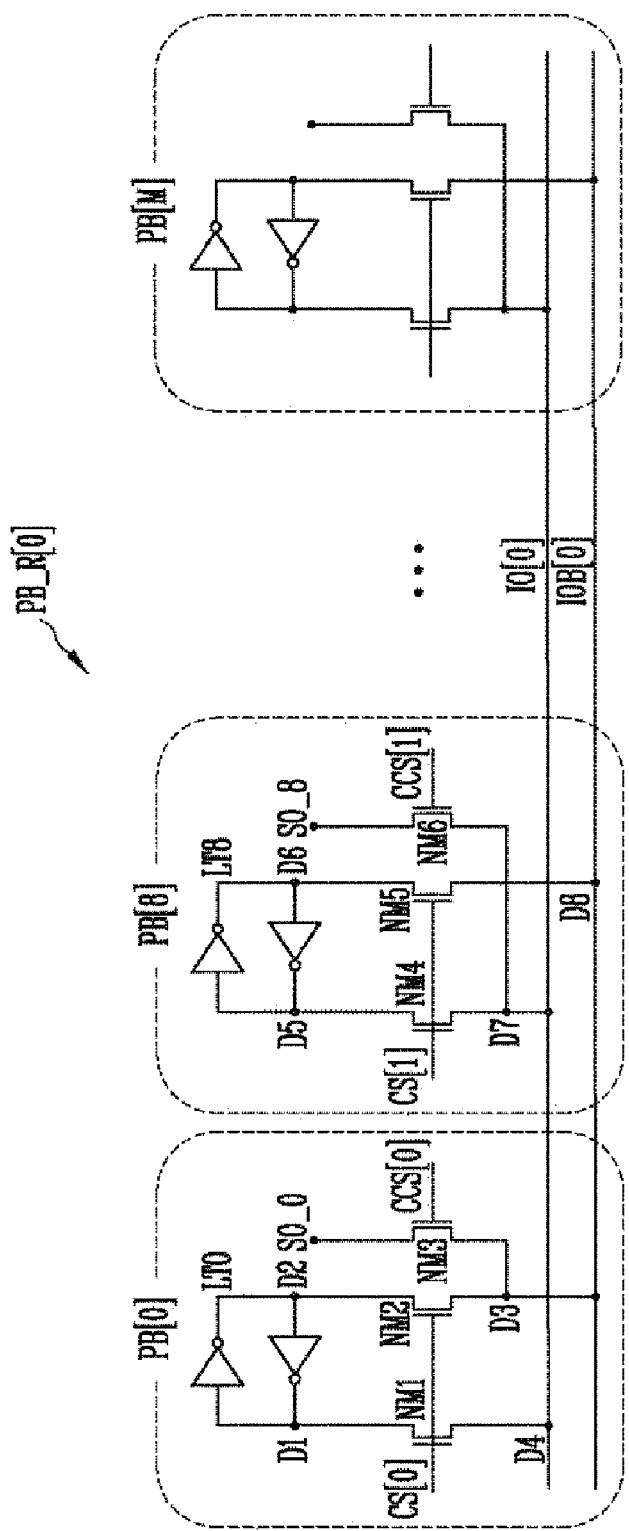
FIG. 2B is a circuit diagram of a page buffer shown in FIG. 2A.

FIG. 2B is a circuit diagram of the page buffer shown in FIG. 2A. This figures shows part of the data output part of the first page buffer row PB_R[0] of the page buffer unit 220.

The first page buffer PB[0] of the even page buffer column and the ninth page buffer PB[8] of the odd page buffer column are described as an example, the other page buffers of the page buffer unit 220 may have a similar construction and function as the first page buffer PB[0] and ninth page buffer PB[8]. The first page buffer PB[0] includes a first latch LT0 and first to third NMOS transistors NM1 to NM3. The ninth page buffer PB[8] includes a ninth latch LT8 and fourth to sixth NMOS transistors NM4 to NM6.

The first latch LT0 of the first page buffer PB[0] is coupled between a node D1 and a node D2. The first NMOS transistor NM1 is coupled between the node D1 and a node D4. The second NMOS transistor NM2 is coupled between the node D2 and a node D3.

A first selection signal CS[0] is inputted to the gates of the first and second NMOS transistors NM1, NM2.

The third NMOS transistor NM3 is coupled between the node D3 and the sense node SO_0 of the first page buffer PB[0]. A first cell current selection signal CCS[0] is inputted to the gate of the third NMOS transistor NM3. The third NMOS transistor NM3 is a switching element which is turned on when a cell current is measured. In the page buffers PB[0] to PB[7] of the even page buffer column, the switching element (i.e., the third NMOS transistor NM3) for measuring a cell current is coupled between the sense node SO_0 of a corresponding page buffer and tan I/O line of an I/O line pair, for example IOB[0] as shown in FIG. 2B for NM3 in PB[0].

The ninth latch LT8 of the ninth page buffer PB[8] of the odd page buffer column is coupled between a node D5 and a node D6.

The fourth NMOS transistor NM4 is coupled between the node D5 and a node D7. The fifth NMOS transistor NM5 is coupled between the node D6 and a node D8. A second selection signal CS[1] is inputted to the gates of the fourth and fifth NMOS transistors NM4, NM5.

The sixth NMOS transistor NM6 is coupled between the node D7 and a sense node SO_8. A second cell current selection signal CCS[1] is inputted to the gate of the sixth NMOS transistor NM6. The sixth NMOS transistor NM6 is a switching element for measuring a cell current and is coupled between the sense node SO_8 of the corresponding page buffer and the I/O line IO[0] via node D7.

The node D4 and the node D7 are coupled to the first I/O line IO[0], and the node D3 and the node D8 are coupled to the second I/O line IOB[0].

The construction of the Y decoder unit 230 for controlling the data input and output of the first to $N^{th}$ page buffer columns PB_C[0] to PB_C[N] is described below.

Figure 2C:
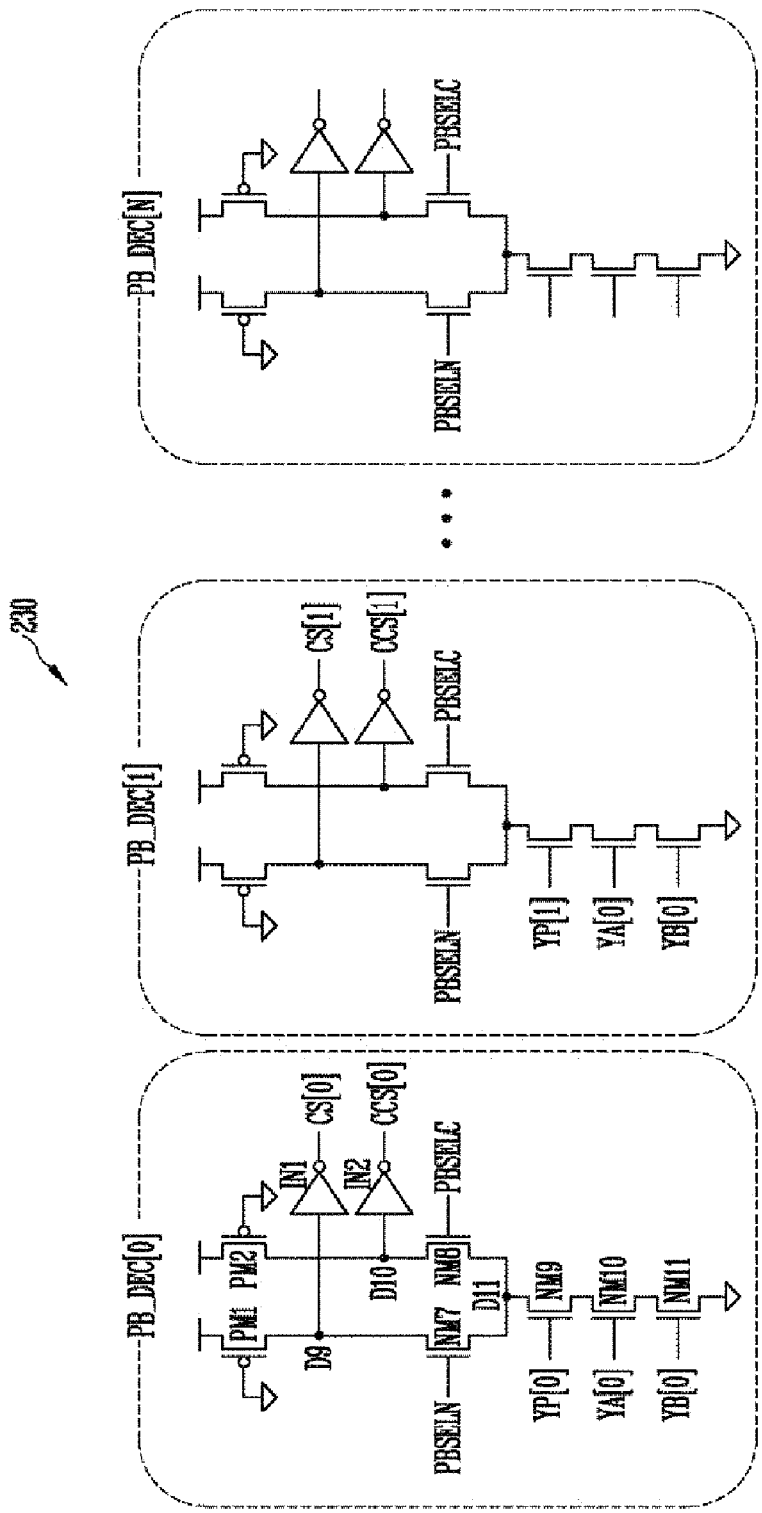
FIG. 2C is a circuit diagram of a Y decoder unit shown in FIG. 2A.

FIG. 2C is a circuit diagram of the Y decoder unit 230 shown in FIG. 2A. This figure is a detailed circuit diagram of the first to $N^{th}$ decoders PB_DEC[0] to PB_DEC[N] of the Y decoder unit 230. The first decoder PB_DEC[0] for selecting the page buffers of the first page buffer column PB_C[0] is described as an example. The other decoders, PB_DEC[1] to PB_DEC[N] have a similar construction to PB_DEC[0].

As shown in FIG. 2C, the first decoder PB_DEC[0] includes first and second PMOS transistors PM1, PM2, first and second inverters IN1, IN2, and seventh to eleventh NMOS transistors NM7 to NM11.

The first PMOS transistor PM1 is coupled between a power supply voltage input terminal and a node D9. The second PMOS transistor PM2 is coupled between the power supply voltage input terminal and a node D10. The gates of the first and second PMOS transistors PM1, PM2 are coupled to a ground node. Accordingly, the first and second PMOS transistors PM1, PM2 are in a turn-on state.

The seventh NMOS transistor NM7 is coupled between the node D9 and a node D11. The eighth NMOS transistor NM8 is coupled between the node D10 and the node D11. A first page buffer selection signal PBSELN is inputted to the gate of the seventh NMOS transistor NM7. A second page buffer selection signal PBSELC is inputted to the gate of the eighth NMOS transistor NM8.

The ninth to eleventh NMOS transistors NM9 to NM11 are coupled in series between the node D11 and the ground node. Y address signals YP[0], YA[0], and YB[0] are respectively inputted to the gates of the ninth to eleventh NMOS transistors NM9 to NM11.

In the first decoder PB_DEC[0], when the ninth to eleventh NMOS transistors NM9 to NM11 are turned on in response to the Y address signals YP[0], YA[0], and YB[0], the node D11 is coupled to the ground node.

The first inverter IN1 inverts a voltage level of the node D9 and outputs an inverted voltage level. The output signal of the first inverter IN1 is the first selection signal CS[0]. The second inverter IN2 inverts a voltage level of the node D10 and outputs an inverted voltage level. The output signal of the second inverter IN2 is the first cell current selection signal CCS[0].

The first decoder PB_DEC[0] is selected in response to the Y address signals YP[0], YA[0], and YB[0]. The first selection signal CS[0] or the first cell current selection signal CCS[0] of a high level is output in response to the first or second page buffer selection signal PBSELN or PBSELC.

The construction of the I/O control unit 240 for controlling the data input and output of the first to eighth I/O line pairs IO_pair[0] to IO_pair[7] selected by the Y decoder unit 230 is described below.

Figure 2D:
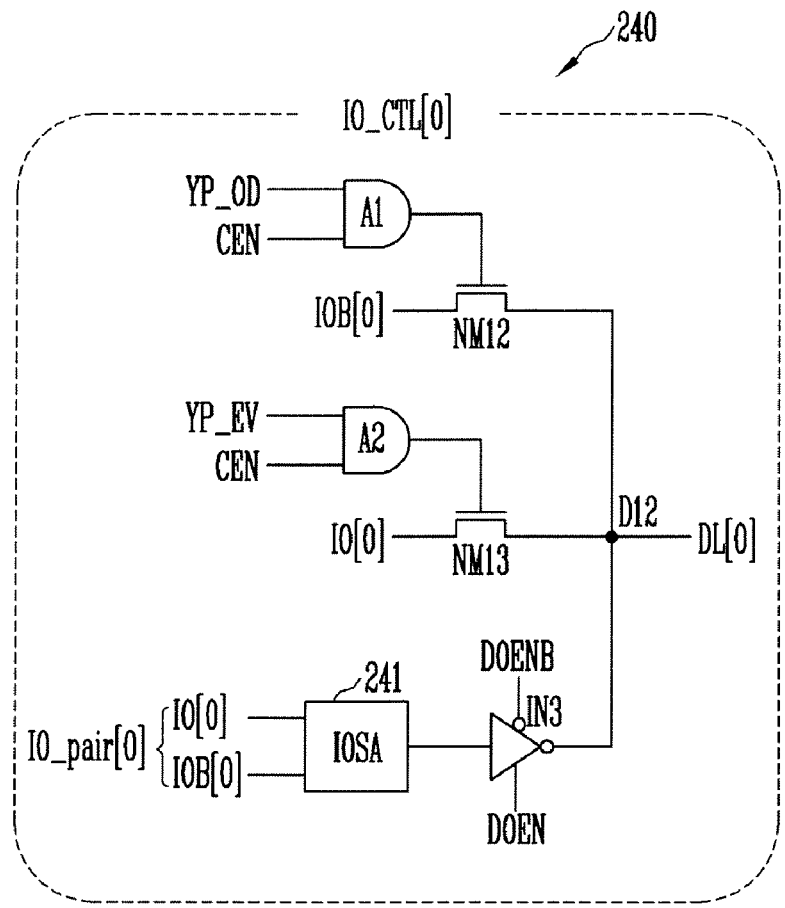
FIG. 2D is a circuit diagram of an I/O control unit shown in FIG. 2A.

FIG. 2D is a circuit diagram of the I/O control unit 240 shown in FIG. 2A. Each I/O controller, IO_CTL[0] to IO_CTL[7], of the I/O control unit 240 has a similar construction. Therefore, FIG. 2D describes the first controller IO_CTL[0] as exemplary of the contruction of all the controllers, that is, first to eighth controllers IO_CTL[0] to IO_CTL[7] of the I/O control unit 240.

The first controller IO_CTL[0] includes first and second AND gates A1, A2, twelfth and thirteenth NMOS transistors NM12, NM13, a third inverter IN3, and an IOSA 241.

An odd cell current measurement control signal YP_OD and the first selection enable signal CEN are inputted to the first AND gate A1. The output signal of the first AND gate A1 is inputted to the gate of the twelfth NMOS transistor NM12. The twelfth NMOS transistor NM12 is coupled between the second I/O line IOB[0] and a node D12. The node D12 is coupled to the first data line DL[0].

An even cell current measurement control signal YP_EV and the first selection enable signal CEN are inputted to the second AND gate A2. The output signal of the second AND gate A2 is inputted to the gate of the thirteenth NMOS transistor NM13. The thirteenth NMOS transistor NM13 is coupled between the first I/O line IO[0] and the node D12.

The first and second I/O lines IO[0], IOB[0] (i.e., the first I/O line pair IO_pair[0]) are coupled to the IOSA 241. The IOSA 241 detects data of the corresponding page buffer, received through the first I/O line pair IO_pair[0], and outputs the detected data.

The third inverter IN3 inverts data, output from the IOSA 241, and outputs the inverted data to the node D12. The third inverter IN3 is operated in response to first and second data output enable signals DOEN, DOENB. The third inverter IN3 is operated when the first data output enable signal DOEN is at a high level and the second data output enable signal DOENB is at a low level.

The construction of the page buffer selector 250 is described below.

Figure 2E:
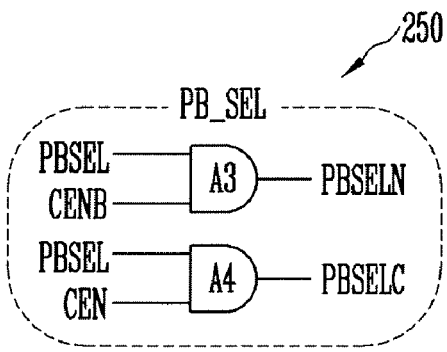
FIG. 2E is a diagram showing a page buffer selector shown in FIG. 2A.

FIG. 2E is a diagram showing the page buffer selector PB_SEL 250 shown in FIG. 2A.

Referring to FIG. 2E, the page buffer selector 250 includes third and fourth AND gates A3, A4. The page buffer selection signal PBSEL and the second selection enable signal CENB are inputted to the third AND gate A3. The output signal of the third AND gate A3 is the first page buffer selection signal PBSELN.

The page buffer selection signal PBSEL and the first selection enable signal CEN are inputted to the fourth AND gate A4. The output signal of the fourth AND gate A4 is the second page buffer selection signal PBSELC.

The operations of inputting and outputting data and of measuring a cell current, of the nonvolatile memory device 200 according to an embodiment of this disclosure, are performed as follows.

In the data output mode for outputting data, the page buffer selection signal PBSEL and the second selection enable signal CENB of a high level are received. The first selection enable signal CEN of a low level is received.

In response to the page buffer selection signal PBSEL and the second selection enable signal CENB being at a high level, the third AND gate A3 of the page buffer selector 250 outputs the first page buffer selection signal PBSELN at a high level.

Since the first selection enable signal CEN is in a low level, the fourth AND gate A4 outputs the second page buffer selection signal PBSELC at a low level.

The first page buffer selection signal PBSELN at a high level and the second page buffer selection signal PBSELC at a low level are inputted to the first to $N^{th}$ decoders PB_DEC [0] to PB_DEC[N] of the Y decoder unit 230.

In response to the Y address signals YP[0], YA[0], and YB[0] at a high level, the first decoder PB_DEC[0] is selected, and the first selection signal CS[0] is output at a high level.

In response to the first selection signal CS[0] being at a high level, the latches of the first to eighth page buffers PB[0] to PB[7] of the first page buffer column PB_C[0] are coupled to the first to eighth line pairs IO_pair[0] to IO_pair[7], and so data stored in the first to eighth page buffers PB[0] to PB[7] are output.

The IOSAs 241 of the I/O control unit 240 detect the respective data output by the latches and output the detected data to the data lines. To this end, the third inverter IN3 operates in response to the first and second data output enable signals DOEN, DOENB.

Since the first selection enable signal CEN of a low level is received, the first and second AND gates A1, A2 output signals at a low level, and the twelfth and thirteenth NMOS transistors NM12, NM13 are maintained at a turn-off state.

Meanwhile, when a cell current is measured, the even page buffer columns and the odd page buffer columns separately measure their cell currents.

First, to measure a cell current, the page buffer selection signal PBSEL at a high level and the first selection enable signal CEN at a high level are received by the page buffer selector 250.

In response to the first selection enable signal CEN and the page buffer selection signal PBSEL both being at a high level, the fourth AND gate A4 outputs second page buffer selection signal PBSELC at a high level.

In response to the second page buffer selection signal PBSELC being at a high level, a decoder selected in response to a Y address signal, from among the first to $N^{th}$ decoders PB_DEC[0] to PB_DEC[N] of the Y decoder unit 240, outputs the appropriate cell current selection signal of the first to $N^{th}$ cell current selection signals CCS[0] to CCS[N] at a high level.

For example, when the Y address signals YP[0], YA[0], and YB[0] are inputted to the first decoder PB_DEC[0], the first cell current selection signal CCS[0] at a high level is received.

The switching element for measuring a cell current, of the first page buffer column PB_C[0], is turned on in response to the first cell current selection signal CCS[0] being at a high level.

The I/O control unit 240 selects the even or odd page buffer column, selects the first I/O lines (IO[0] to IO[7]) or the second I/O lines (IOB[0] to IOB[7]), and couples the selected I/O lines with the data lines DL[0] to DL[7].

In the nonvolatile memory device 200 according to embodiments of this disclosure, in the case in which data are stored in a page buffer or data stored in a page buffer are read and output, when data stored in a corresponding latch are transferred to the I/O line pair, one transistor (e.g., NM1 or NM2) is used. Accordingly, the performance of data input and output is not reduced. Further, in the embodiments of this disclosure, since the first and second selection enable signals CEN, CENB are not needed as inputs to the page buffer, the number of transistors can be reduced, and thus the area of the page buffer can be reduced.

As described above, in accordance with the nonvolatile memory device of this disclosure, the number of transistors for data input and output and the number of transistors for measuring a cell current are reduced in a page buffer. Accordingly, the area of the page buffer can be reduced, and the data I/O characteristic can be improved.

What is claimed is:

1. A nonvolatile memory device, comprising:
   a page buffer unit comprising page buffers, each coupling first and second input and output (IO) lines and a latch circuit for outputting data together or coupling a sense node and the first or second I/O line together, in response to an operation mode;
   a Y decoder unit comprising decoders, each selecting one or more of the page buffers in response to address signals and outputting a first or second control signal to the selected page buffers in response to the operation mode;
   a mode selection unit outputting first and a second operation selection signals for selecting the operation mode; and
   an I/O control unit comprising I/O control circuits, each detecting data, inputted and output through the first and second I/O lines, and outputting the detected data or coupling one of the first and second I/O lines to a data line.

2. The nonvolatile memory device of claim 1, wherein the page buffers of the page buffer unit are arranged in a form of a matrix.

3. The nonvolatile memory device of claim 2, wherein each of the page buffers comprises:
   first and second switching elements configured to respectively couple the first and second I/O lines and first and second nodes of the latch circuit together in response to the first control signal; and
   a third switching element configured to couple the sense node and one of the first and second I/O lines together in response to the second control signal.

4. The nonvolatile memory device of claim 3, wherein:
   in each of the page buffers of even page buffer columns included in the page buffer unit, the third switching element is coupled between the sense node and the first I/O line,
   in each of the page buffers of odd page buffer columns included in the page buffer unit, the third switching element is coupled between the sense node and the second I/O line.

5. The nonvolatile memory device of claim 4, wherein the page buffers included in one of page buffer rows of the page buffer unit are coupled to respective I/O line pairs, each I/O line pair comprising corresponding first and second I/O lines, through the first and second switching elements.

6. The nonvolatile memory device of claim 5, wherein each decoder of the decoders are coupled to a respective page buffer column of the page buffer unit and configured to select the respective page buffer column and each output the first or the second control signal in response to the operation mode.

7. The nonvolatile memory device of claim 6, wherein each of the decoders outputs the first control signal in response to the first operation selection signal indicative of a data I/O mode and outputs the second control signal in response to the second operation selection signal indicative of a cell current measurement mode.

8. The nonvolatile memory device of claim 7, wherein each of the decoders comprises:
   a fourth switching element coupled between a power supply voltage input terminal and a third node and maintained in a turn-on state;
   a fifth switching element coupled between the power supply voltage input terminal and a fourth node and maintained in a turn-on state;
   a sixth switching element coupled between the third node and a fifth node and turned on in response to the first operation selection signal;
   a seventh switching element coupled between the fourth node and the fifth node and turned on in response to the second operation selection signal;
   a plurality of eighth switching elements configured to couple the fifth node and a ground node in response to respective address signals;
   a first inverter configured to invert a voltage level of the third node and output an inverted voltage level as the first control signal; and
   a second inverter configured to invert a voltage level of the fourth node and output an inverted voltage level as the second control signal.

9. The nonvolatile memory device of claim 4, wherein each of the I/O control circuits comprises:
   a ninth switching element configured to couple the first I/O line and the data line together in response to a first page buffer selection signal for selecting the even page buffer columns in a cell current measurement mode;
   a tenth switching element configured to couple the second I/O line and the data line together in response to a second page buffer selection signal for selecting the odd page buffer columns in the cell current measurement mode;
   a data sense unit, configured to detect data, coupled to the first and second I/O lines in a data I/O mode, and also configured to output the detected data; and
   a third inverter configured to invert the data output by the data sense unit in response to a data I/O enable signal and output the inverted data to the data line.

10. The nonvolatile memory device of claim 9, wherein the I/O control circuit further comprises a first AND gate and a second AND gate,
   wherein the first AND gate performs an AND operation of the first page buffer selection signal and a first enable signal for enabling measurement of a cell current, and the second AND gate performs an AND operation of the first enable signal and the second page buffer selection signal, and the ninth switching element configured to couple the first I/O line and the data line together is operated in response to an output signal of the first AND gate, and the tenth switching element configured to couple the second I/O line and the data line together is operated in response to an output signal of the second AND gate.

11. The nonvolatile memory device of claim 10, wherein the mode selection unit comprises:
a third AND gate for performing an AND operation of the first or second page buffer selection signal and a second enable signal having an opposite logic level to the first enable signal; and
a fourth AND gate for performing an AND operation of the first enable signal and the page buffer selection signal,
wherein an output signal of the third AND gate is the first control signal, and an output signal of the fourth AND gate is the second control signal.

12. A nonvolatile memory device, comprising:
a page buffer unit, comprising page buffers arranged in a form of a matrix and coupled to I/O line pairs corresponding to respective page buffer rows, wherein each of the page buffers is coupled to one or more of bit lines to which memory cells are coupled through a sense node and configured to couple each of the I/O line pairs and a latch circuit for outputting data together in response to an operation mode or to select one I/O line of the I/O line pair and to couple the selected I/O line and the sense node;
a Y decoder unit, comprising first to $N^{th}$ decoders coupled to respective N page buffer columns of the page buffer unit and each configured to output a first or a second control signal in response to address signals and first and second operation mode selection signals, where Nth corresponds to a column of the page buffer unit;
a mode selection unit outputting the first and second operation selection signals for selecting the operation mode; and
an I/O control unit, comprising I/O control circuits coupled to the I/O line pairs, respectively, and each configured to detect data inputted and output through each of the I/O line pairs and output the detected data or to couple one of the first or second I/O lines to a data line.

13. The nonvolatile memory device of claim 12, wherein each of the page buffers comprises:
first and second switching elements configured to couple first and second nodes of the latch circuit and first and second I/O lines of the I/O line pair, respectively, in response to the first control signal for data input and output, and
third switching element coupled between each of the sense nodes and any one of the first and second I/O line in response to the second control signal for measuring a cell current.

14. The nonvolatile memory device of claim 13, wherein:
in each of the page buffers of even page buffer columns included in the page buffer unit, the third switching element is coupled between the sense node and the first I/O line,
in each of the page buffers of odd page buffer columns included in the page buffer unit, the third switching element is coupled between the sense node and the second I/O line.

15. The nonvolatile memory device of claim 14, wherein each of the decoders outputs the first control signal in response to the first operation selection signal indicative of a data I/O mode and outputs the second control signal in response to the second operation selection signal indicative of a cell current measurement mode.

16. The nonvolatile memory device of claim 15, wherein each of the decoders comprises:
a fourth switching element coupled between a power supply voltage input terminal and a third node and maintained at a turn-on state;
a fifth switching element coupled between the power supply voltage input terminal and a fourth node and maintained at a turn-on state;
a sixth switching element coupled between the third node and a fifth node and turned on in response to the first operation selection signal;
a seventh switching element coupled between the fourth node and the fifth node and turned on in response to the second operation selection signal;
a plurality of eighth switching elements configured to couple the fifth node and a ground node in response to the respective address signals;
a first inverter configured to invert a voltage level of the third node and output an inverted voltage level as the first control signal; and
a second inverter configured to invert a voltage level of the fourth node and output an inverted voltage level as the second control signal.

17. The nonvolatile memory device of claim 16, wherein each of the I/O control circuits comprises:
a ninth switching element configured to couple the first I/O line and the data line together in response to a first page buffer selection signal for selecting the even page buffer columns in a cell current measurement mode;
a tenth switching element configured to couple the second I/O line and the data line together in response to a second page buffer selection signal for selecting the odd page buffer columns in the cell current measurement mode;
a data sense unit configured to detect data coupled to the first and second I/O lines in a data I/O mode and output the detected data; and
a third inverter configured to invert the data output by the data sense unit in response to a data I/O enable signal and output the inverted data to the data line.

18. The nonvolatile memory device of claim 17, wherein each of the control circuits further comprises a first AND gate and a second AND gate,
wherein the first AND gate performs an AND operation of the first page buffer selection signal and a first enable signal for enabling measurement of a cell current, and the second AND gate performs an AND operation of the first enable signal and the second page buffer selection signal, and
the ninth switching element is operated in response to an output signal of the first AND gate, and the tenth switching element is operated in response to an output signal of the second AND gate.

19. The nonvolatile memory device of claim 18, wherein the mode selection unit comprises:
a third AND gate for performing an AND operation of the first or second page buffer selection signal and a second enable signal having an opposite logic level to the first enable signal; and
a fourth AND gate for performing an AND operation of the first enable signal and the page buffer selection signal,
wherein an output signal of the third AND gate is the first control signal, and an output signal of the fourth AND gate is the second control signal.

* * * * *